(12) United States Patent
Beer (10) Patent No.: US 6,831,320 B2
(45) Date of Patent: Dec. 14, 2004

(54) MEMORY CELL CONFIGURATION FOR A DRAM MEMORY WITH A CONTACT BIT TERMINAL FOR TWO TRENCH CAPACITORS OF DIFFERENT ROWS

(75) Inventor: Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/675,054

(22) Filed: Sep. 30, 2003

(65) Prior Publication Data

US 2004/0062124 A1 Apr. 1, 2004

(30) Foreign Application Priority Data

Sep. 30, 2002 (DE) .......................................... 102 45 538
Jan. 24, 2003 (DE) .......................................... 103 02 670

(51) Int. Cl.$^7$ .......................................... H01L 27/108
(52) U.S. Cl. ....................................... 257/301; 257/302
(58) Field of Search ................................ 257/301, 302, 257/300, 311, 394, 396, 401, 544

(56) References Cited

U.S. PATENT DOCUMENTS 5,600,162 A * 2/1997 Rosner ....................... 257/311

6,388,283 B1 5/2002 Owen
6,496,401 B2 12/2002 Weis

FOREIGN PATENT DOCUMENTS

DE 198 13 169 A1 10/1999
DE 100 27 912 A1 12/2001

* cited by examiner

Primary Examiner—David Nelms
Assistant Examiner—Thinh T Nguyen
(74) Attorney, Agent, or Firm—Laurence A. Greenberg; Werner H. Stemer; Ralph E. Locher (57) ABSTRACT

A memory cell configuration connects two trench capacitors to a bit line through a contact bit terminal. Trench capacitors are disposed in a regular grid. Word and bit lines are disposed in a mutually perpendicular crossover structure. An active region in which a selection transistor of an adjoining trench capacitor is introduced is disposed respectively between two trench capacitors of a row. Trench capacitors of two rows are laterally offset with respect to one another. Two active regions of adjacent rows are electrically connected to one another through a connecting line. Connected active regions form a common terminal region connected to a contact bit terminal, which is connected to a bit line. Bit lines are disposed between rows of trench capacitors and parallel thereto. By reducing the contact bit terminals, capacitances of the bit lines are reduced and interference signal transmission between word line and contact bit terminals is reduced.

16 Claims, 11 Drawing Sheets

MEMORY CELL CONFIGURATION FOR A DRAM MEMORY WITH A CONTACT BIT TERMINAL FOR TWO TRENCH CAPACITORS OF DIFFERENT ROWS

BACKGROUND OF THE INVENTION

1. Field of the Invention

The invention relates to a memory cell configuration, in particular for a DRAM memory module with memory cells that have a trench capacitor and a selection transistor, the trench capacitor being at least partly introduced into a semiconductor material.

Memory modules, in particular, dynamic random access memories (DRAMs), contain one or more cell arrays having memory cells. The memory cells are disposed in a matrix of rows and columns in a cell array. A memory cell has a selection transistor and a capacitor. A word line forms a control terminal of the selection transistor. The selection transistor is connected to the capacitor by a first terminal and to a bit line by a second terminal. The word lines and the bit lines are disposed perpendicular to one another.

German Published, Non-Prosecuted Patent Application DE 100 27 912 A1, corresponding to U.S. Pat. No. 6,496,401 to Weis, discloses a memory cell configuration of the generic type in which the capacitors are embodied in the form of trench capacitors. Advancing miniaturization of the memory modules means that the distances between the capacitors and the distances between the voltage-carrying regions become smaller and smaller. Moreover, the charge capacitance of the capacitors decreases further, the charge capacitance of the capacitor already being lower than the charge capacitance of the bit line that can be connected to the capacitor. On account of the low charge stored in the capacitor and on account of the short distances between the signal and control lines, such as, e.g., the bit lines and the word lines, the problem of mutual signal influencing arises.

SUMMARY OF THE INVENTION

It is accordingly an object of the invention to provide a memory cell configuration for a DRAM memory with a contact bit terminal for two trench capacitors of different rows that overcomes the hereinafore-mentioned disadvantages of the heretofore-known devices of this general type and that allows a high density of trench capacitors and, moreover, has a reduced signal coupling between the signal and/or control lines.

With the foregoing and other objects in view, there is provided, in accordance with the invention, a memory cell configuration, including a semiconductor material having active regions, word lines and bit lines, memory cells each having a trench capacitor and a selection transistor, the trench capacitor being at least partly introduced into the semiconductor material and being electrically conductively connected to a bit line through the selection transistor, each of the selection transistors of the memory cells having a control terminal formed by a word line and first and second terminal regions formed in an active region of the semiconductor material, the first terminal region being conductively connected to a respective one of the trench capacitors, the trench capacitors of the memory cells being disposed in rows, the active regions being disposed respectively between two of the trench capacitors of the memory cells, a connecting line electrically conductively connecting two second terminal regions of two of the selection transistors of adjacent ones of the rows to one another and forming a common terminal region for two of the trench capacitors of different rows, and a contact bit terminal being electrically conductively connected to the common terminal region and being electrically conductively connected to a bit line.

The memory cell configuration according to the invention has the advantage that the trench capacitors are at a short distance from one another and, nevertheless, two trench capacitors can, optionally, be electrically conductively connected to a bit line through a contact bit terminal. The capacitances of the bit lines are reduced as a result of the saving of contact bit terminals.

The configuration according to the invention makes it possible, despite the compact configuration, for two trench capacitors to be electrically conductively connected to a bit line through a contact bit terminal. This is possible by virtue of the fact that a contact bit terminal is electrically conductively connected to two trench capacitors of different rows. The electrical coupling between the word lines (control lines) and the contact bit terminals (signal lines) is reduced as a result of the saving of a contact bit terminal. This affords higher interference signal immunity for reading out the information from the memory cells.

In accordance with another feature of the invention, the trench capacitors are, preferably, disposed in a regular grid, a central trench capacitor in each case being surrounded by four adjacent trench capacitors, the centers of the four surrounding trench capacitors in each case preferably being at the same distance from the center of the central trench capacitor, making possible a dense and regular configuration of the trench capacitors. The dense configuration results in a lower area requirement, and the regular configuration means that the layout for the trench capacitors can be produced simply and cost-effectively.

In accordance with a further feature of the invention, the contact bit terminal is disposed between two nearest word lines. Disposed adjacent to a nearest word line there is in each case a further word line, which form the control terminals for the selection transistors of the trench capacitors that can be conductively connected to the contact bit terminal. A simple, symmetrical, and compact configuration of the word lines is made possible in this way.

In accordance with an added feature of the invention, the trench capacitors have an upwardly tapering cross-sectional form. Moreover, the contact bit terminal is at least partly disposed above a trench capacitor. Such a configuration additionally saves the surface area. As a result, the memory cell configuration can be fabricated cost-effectively.

In accordance with an additional feature of the invention, the second terminal region of a respective selection transistor of an adjacent one of the trench capacitors is at least partly disposed above the trench capacitor and the contact bit terminal is at least partly disposed above the trench capacitor and is electrically conductively connected to the second terminal region and to the bit line.

In accordance with yet another feature of the invention, the word lines are at least partly routed above the trench capacitors.

In accordance with yet a further feature of the invention, the word lines are routed parallel beside one another and above trench capacitors. A simple, symmetrical and space-saving structure is achieved in this way.

In accordance with yet an added feature of the invention, the connecting line is introduced into the semiconductor material in the form of a doped region.

In accordance with yet an additional feature of the invention, the connecting line is embodied in the form of a conductive layer applied to the semiconductor material.

In accordance with again another feature of the invention, the height of the conductive layer preferably lies in the range of approximately 10 to 50 nm. The small height affords a reduction of the signal influencing between word line and signal line.

In accordance with again a further feature of the invention, a trench capacitor has a center and is surrounded by four trench capacitors each having centers at the same distance from the center of the trench capacitor.

In accordance with again an added feature of the invention, the connecting line between the two second terminal regions of the two trench capacitors that can be connected to a common contact bit terminal is embodied in the form of a doped region introduced into the semiconductor material.

In accordance with again an additional feature of the invention, the memory cell configuration has crossed bit lines, a true and a complementary bit line of a bit line pair being disposed in crossed fashion and being routed to a common amplifier circuit. The crossed configuration of the bit lines results in a reduction of the signal influencing between the bit lines during the read-out of a charge of a memory cell.

In accordance with still another feature of the invention, there are provided amplifier circuits, the bit lines being true and complementary bit lines alternately disposed one beside the other, a true and a complementary bit line forming a bit line pair, the bit line pair being routed to one of the amplifier circuits, the bit lines of the bit line pair being disposed in transposed fashion.

In accordance with still a further feature of the invention, the trench capacitors of two of the rows disposed one beside the other are disposed offset with respect to one another.

In accordance with still an added feature of the invention, the contact bit terminal is disposed between two rows of the trench capacitors and the bit lines are disposed between the rows of the trench capacitors and parallel to the rows of trench capacitors.

In accordance with a concomitant feature of the invention, the contact bit terminal is disposed between two rows of the trench capacitors, and at least one of the bit lines and the true and complementary bit lines are disposed between the rows of the trench capacitors and parallel to the rows of trench capacitors.

Other features that are considered as characteristic for the invention are set forth in the appended claims.

Although the invention is illustrated and described herein as embodied in a memory cell configuration for a DRAM memory with a contact bit terminal for two trench capacitors of different rows, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

The invention is described below using the example of a DRAM memory module with trench capacitors. The memory cell configuration according to the invention can also be used in other memory modules.

Figure 1:
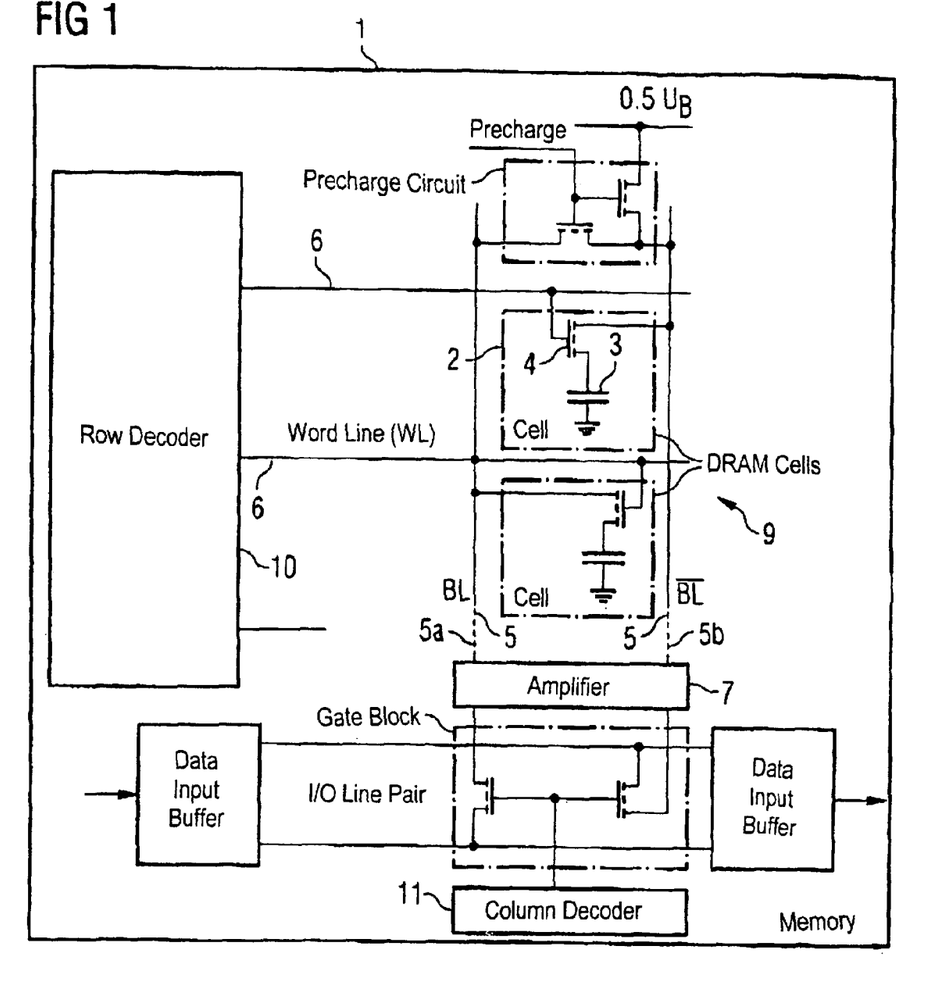
FIG. 1 is a block and schematic circuit diagram of a DRAM memory module according to the invention.

Referring now to the figures of the drawings in detail and first, particularly to FIG. 1 thereof, there is shown a memory module 1, which is formed as a DRAM memory module and is realized using semiconductor technology. Only the parts of the memory module that are of importance for understanding the invention are illustrated in FIG. 1.

The memory module 1 has a cell array 9, in which memory cells 2 are disposed. Each memory cell 2 includes a selection transistor 4 and a capacitor 3. The capacitor 3 is connected to a first terminal of the selection transistor 4. A second terminal of the selection transistor 4 is connected to a bit line 5. A control terminal of the selection transistor 4 is connected to a word line 6. The word lines 6 are connected to a row decoder 10, and the bit lines 5 are connected to an amplifier circuit 7.

To read out an item of information from a memory cell 2, the address of the memory cell to be read is fed to an address decoder, which divides the address into a row address and into a column address. The row address is sent to the row decoder 10, and the column address is sent to the column decoder 11. Upon receiving the row address of the memory cell, the row decoder 10 selects the corresponding word line 6 and activates the corresponding word line, i.e., a voltage potential is applied to the selected word line. The voltage potential of the word line turns on the selection transistor 4 so that the charge of the capacitor 3 of the selected memory cell 2 flows onto the connected bit line 5 through the selection transistor 4. The bit line 5 carries the read-out charge to the amplifier circuit 7. The read-out charge is compared with a charge of a reference bit line. The voltage differences between the bit line and the reference bit line are spread by the amplifier circuit 7. The magnified voltage differences are fed to a gate block. The selected bit line and the reference bit line are represented by a true and a complementary bit line 5a, 5b.

Because the selected word line 6 is connected to a multiplicity of selection transistors 4, a further selection of the bit line pair is necessary to read out the charge of a desired memory cell. The further selection is performed by the column decoder 11. After receiving the column address of the memory cell to be selected, the column decoder 11 selects the corresponding gate block of the bit line pair, from which the charge of the memory cell 2 to be read is applied to a bit line. Through the selection of the gate block, the voltage potentials of the two bit lines of the bit line pair are forwarded to a data output buffer through transistors. Depending on the ratio of the voltage potentials of the two bit lines of the bit line pair, a logic "1" or a logic "0" is identified as information of the memory cell.

Advancing miniaturization of the capacitors means that the charge stored in the capacitors is very small and the capacitance of the capacitors is less than the capacitance of a bit line 5. The low charge of the capacitors 3 makes it necessary to reduce mutual charge influencing between the signal lines and/or the control lines, in particular, between the bit lines and the word lines. Furthermore, it is necessary to make the bit line capacitance as small as possible to improve the effect of the capacitance of the memory cell for detecting a charge.

Figure 2:
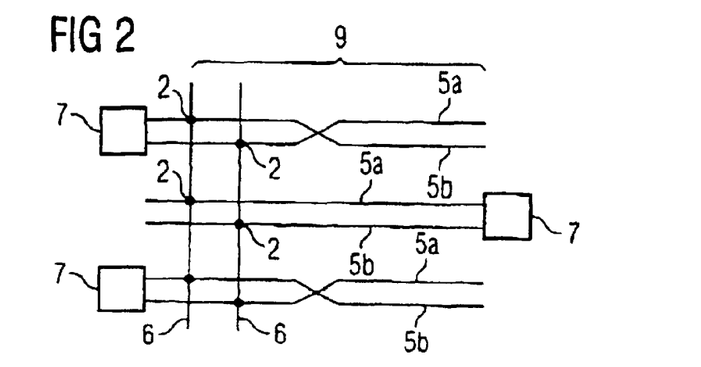
FIG. 2 is a fragmentary block circuit diagram of a memory cell array according to the invention with crossed bit lines.

To reduce the electrical coupling between the bit lines, two bit lines 5a, 5b of a bit line pair are disposed alternately in crossed fashion, as illustrated in FIG. 2. Moreover, a plurality of amplifier circuits 7 are disposed on opposite sides of the memory cell array 9. The bit line pairs 5a, 5b are routed to amplifier circuits 7 which are disposed alternately on different sides of the cell array 9. A word line 6 drives memory cells 2 that are connected to every second bit line 5a, 5b through a contact bit terminal 16. Adjacent word lines 6 drive memory cells 2 that are connected to different bit lines 5a, 5b through contact bit terminals 16.

The memory cell configuration according to the invention may, preferably, be used in a word line and bit line structure in accordance with the example of FIG. 2, in which crossed bit lines are disposed. The crossed bit lines are electrically insulated from one another, but, due to their crossed configuration, bring about a lower mutual influencing of the voltage potential during the read-out of a charge from a memory cell 2. However, the memory cell configuration according to the invention can also be used in any other type of word and bit line structure.

Figure 3:
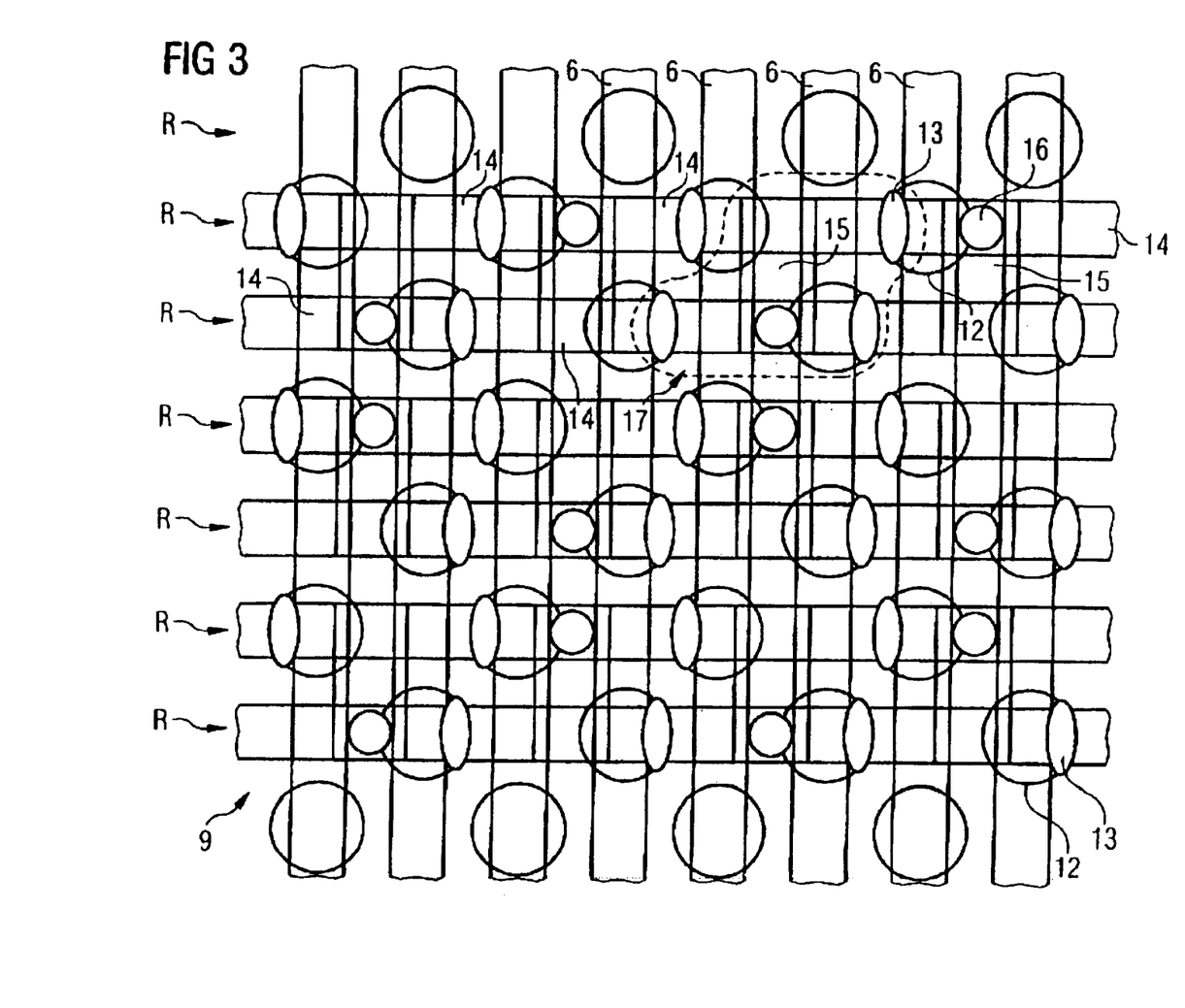
FIG. 3 is a fragmentary cross-sectional view of a detail of the memory cell array according to the invention.

FIG. 3 shows a schematic illustration of a detail from a circuit layout for the memory cell configuration of the cell array 9. The word lines 6 are disposed parallel beside one another in the form of straight tracks. In the exemplary embodiment illustrated, the capacitors of the memory cells are embodied in the form of cross-sectionally circular trench capacitors 12. Cross-sectionally oval trench capacitors may also be provided instead of the circular trench capacitors. The trench capacitors 12 have a contact terminal 13. Also illustrated are contact bit terminals 16 that are routed to bit lines 5 (not illustrated in FIG. 3). The trench capacitors 12 are disposed in a regular pattern, each trench capacitor preferably being surrounded by four adjacent trench capacitors 12, the centers of which are, preferably, at the same distance from the center of the central trench capacitor 12. The trench capacitors 12 are disposed in rows R, the trench capacitors 12 of two rows being disposed offset with respect to one another in the row direction. The direction of the rows is indicated in the form of arrows.

The contact terminals 13 of the trench capacitors 12 are always disposed on the same side in a row. In successive rows, from top to bottom in FIG. 3, the contact terminals 13 are disposed on different sides of the trench capacitors 12, but always in the row direction, i.e., laterally with respect to the trench capacitor. An active region 14 is formed between two trench capacitors 12 in the row direction. Parts of the selection transistor 4, by which a trench capacitor 12 can be connected to a bit line 5, are disposed in the active region 14. The active region 14 is electrically insulated in each case by the trench capacitors 12 in the row direction. In the lateral direction, the individual active regions 14 are electrically insulated by non-illustrated insulation layers to avoid mutual influencing.

According to the invention, in each case two active regions 14 of two rows that are disposed beside one another partly overlapping in the row direction are electrically connected to one another through a connecting line 15. The two active regions 14 that are electrically connected through the connecting line 15 form a common terminal region 17. The terminal region 17 is connected to a contact bit terminal 16, which is routed upward to a bit line 5. Four trench capacitors 12 adjoin the terminal region 17. Two inner trench capacitors are at a first distance from one another. Two outer trench capacitors 12 are at a second distance from one another. The first distance is less than the second distance. The inner trench capacitors are not electrically conductively connected to the terminal region 17. The two outer trench capacitors 12 can be electrically conductively connected to the terminal region 17 through the contact terminals 13 and the selection transistors 4.

The embodiment chosen makes it possible to achieve a high density of the trench capacitors 12 and, nevertheless, provide an electrical contact between two trench capacitors and a bit line 5 through only one common contact bit terminal 16.

The word lines 6 are, preferably, at least partly routed above trench capacitors 12. The contact bit terminals 16 illustrated are at least partly disposed above a lower wider cross-section of a trench capacitor.

A contact bit terminal 16 is disposed between two nearest word lines 6 that, however, are not connected to the selection transistors of the trench capacitors 12 that can be electrically conductively connected to the contact bit terminal 16. Disposed at the respective sides of the nearest word lines that are remote from the contact bit terminal 16 there are further word lines 6, which form the control terminals for the selection transistors 4 of the trench capacitors 12 that can be electrically conductively connected to the contact bit terminal 16.

Figure 4:
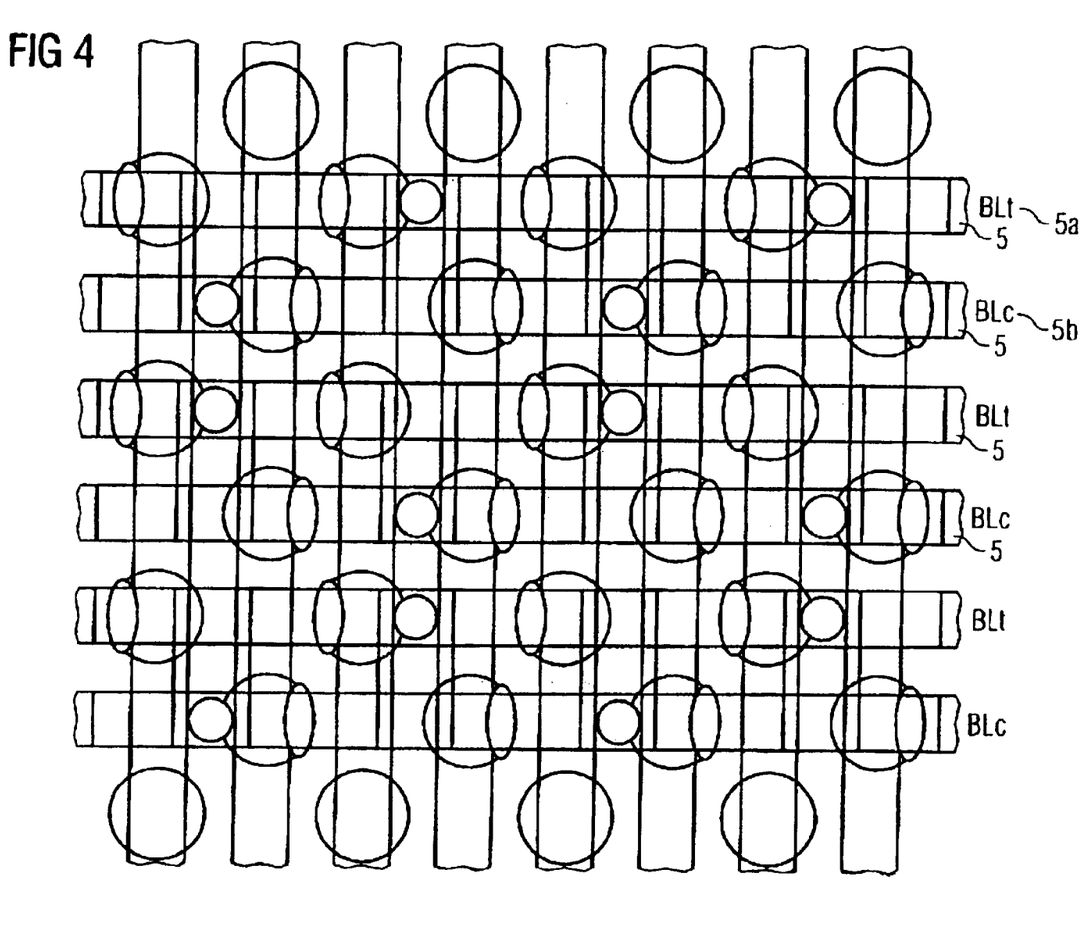
FIG. 4 is a fragmentary cross-sectional view of the detail of the memory cell array of FIG. 3 with bit lines.

FIG. 4 shows the same detail as FIG. 3, the bit lines 5 additionally being illustrated. In the exemplary embodiment illustrated, the bit lines 5 are disposed perpendicular to the word lines 6 and above the active regions 14 along a row of trench capacitors 12. The bit lines 5 are disposed alternately as bit line true (BLt) and as complementary bit line (BLc), a complementary and a true bit line forming a bit line pair that is connected to an amplifier circuit 7 for the purpose of evaluating the information content of a memory cell, as described in connection with FIG. 1.

Figure 5:
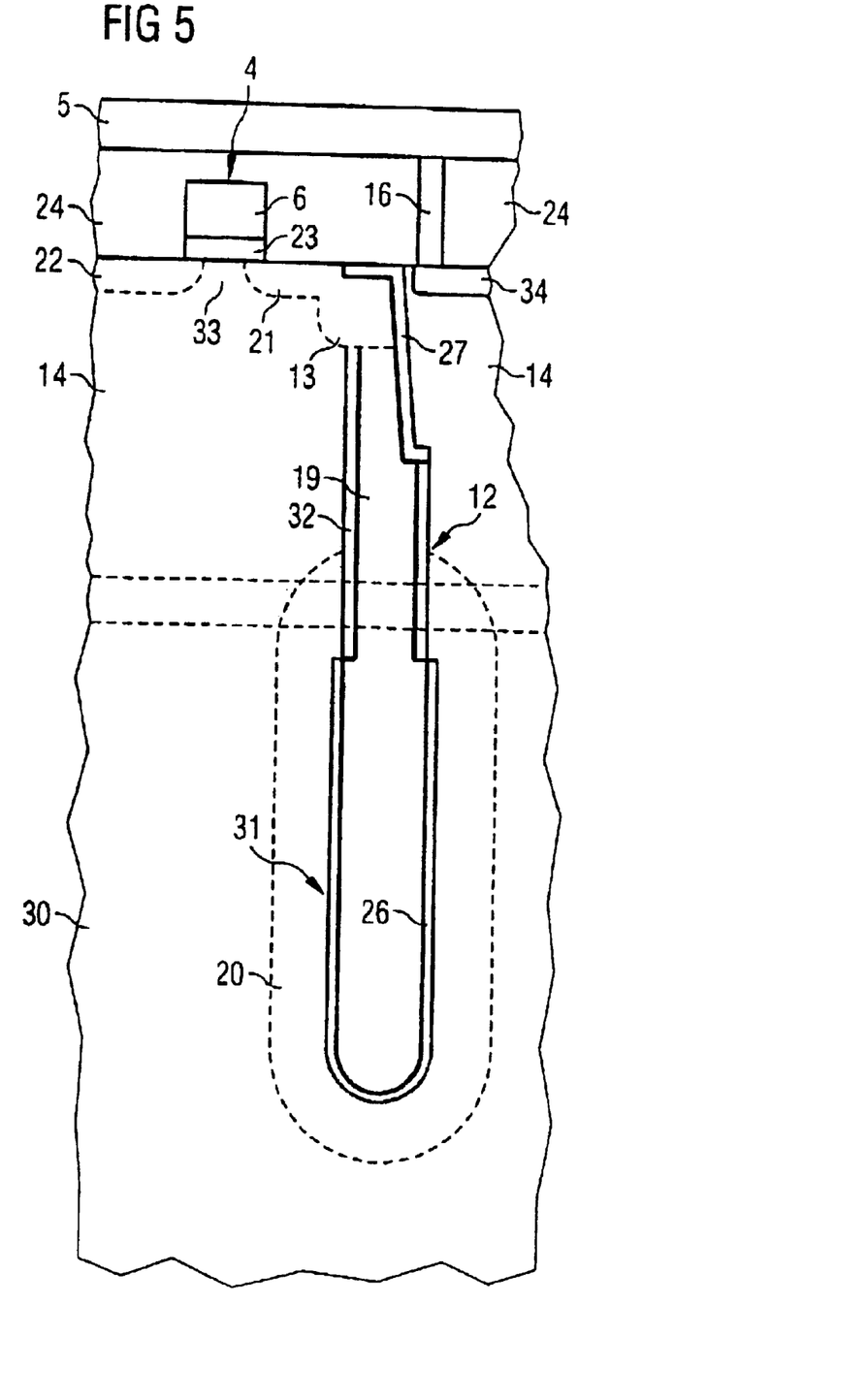
FIG. 5 is a fragmentary, cross-sectional view through a trench capacitor according to the invention with a selection transistor and a contact bit terminal.

FIG. 5 shows a cross-section through a trench capacitor 12 and parts of the adjoining active regions 14. A trench capacitor 12 is introduced into a semiconductor substrate 30, a trench 31 being introduced into the semiconductor substrate 30, the trench 31 having a larger circular cross-section in a lower region than in an upper region. A silicon substrate is, preferably, used as the semiconductor substrate. The silicon substrate is, preferably, weakly p-doped. The trench 31 is filled with an electrically conductive layer, preferably, with polysilicon that, by way of example, is highly n-doped with arsenic or phosphorus. The conductive layer forms an inner electrode 19 of the trench capacitor 12. The inner electrode 19 is surrounded with a storage dielectric layer 26. An outer electrode 20 is formed in a manner adjoining a lower region of the trench 31. The outer electrode 20 is formed as a highly n-doped region and surrounds the trench 31 as far as a central region. In the upper region, the cross-section of the trench 31 tapers and is surrounded by an insulation collar 32. The inner electrode 19 is tapered further on one side and is electrically insulated from the adjoining semiconductor material by a further insulation layer 27.

The further insulation layer 27 is taken as far as the surface of the semiconductor substrate 30. Opposite the further insulation layer 27, in an upper end region, a side region of the insulation collar 32 is opened in the direction of an active region 14. Such a configuration provides an electrically conductive connection between the inner electrode 19 and the active region 14. A first terminal region 21 is disposed directly at the inner electrode 19 and is conductively connected to the inner electrode 19. The first terminal region 21 includes an n-doped region of the semiconductor material, for example. The lateral opening of the inner electrode 19 with respect to the active region 14 forms the contact terminal 13.

A second terminal region 22 is formed in a manner laterally spaced apart from the first terminal region 21. The second terminal region 22, preferably, includes an n-doped region. The first and second terminal regions 21, 22 are laterally spaced apart by a channel region 33. Above the channel region 33, a gate oxide layer 23 is applied on the semiconductor substrate in a manner laterally overlapping the first and second terminal regions 21, 22. A word line 6 is disposed above the gate oxide layer 23. The word line 6, the first and second terminal regions 21, 22, and the channel region 33 form a selection transistor 4 in the form of a field-effect transistor.

The word line 6 is covered by an insulation layer 24 applied on the semiconductor substrate 30. The insulation layer 24 is embodied in the form of a silicon oxide layer, for example. A bit line 5 is disposed on the insulation layer 24 transversely with respect to the longitudinal direction of the word line 6. The trench capacitor 12 electrically isolates two active regions 14, a second terminal region 22 also being introduced in the active region 14 that is disposed on the right beside the further insulation layer 27. The second terminal region 22 is electrically conductively connected to the bit line 5 through a contact bit terminal 16. The contact bit terminal 16 is routed through the insulation layer 24 from the second terminal region 22 as far as the bit line 5. The contact bit terminal 16 is formed, for example, from a metallic material or a conductive polysilicon layer.

Figure 6:
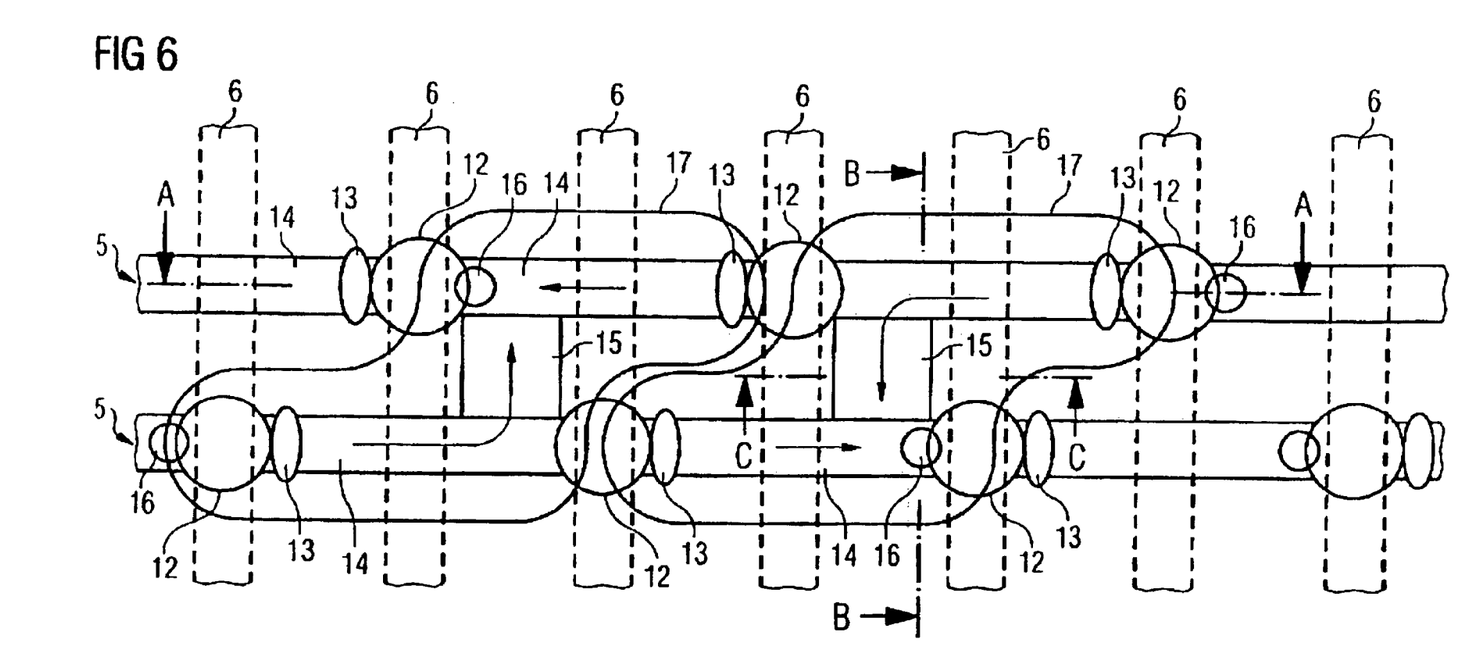
FIG. 6 is a fragmentary, cross-sectional view through a detail of the layout of FIGS. 3 and 4.

FIG. 6 shows a partial detail from FIG. 3, the common terminal regions 17 being surrounded by a line.

Figure 7:
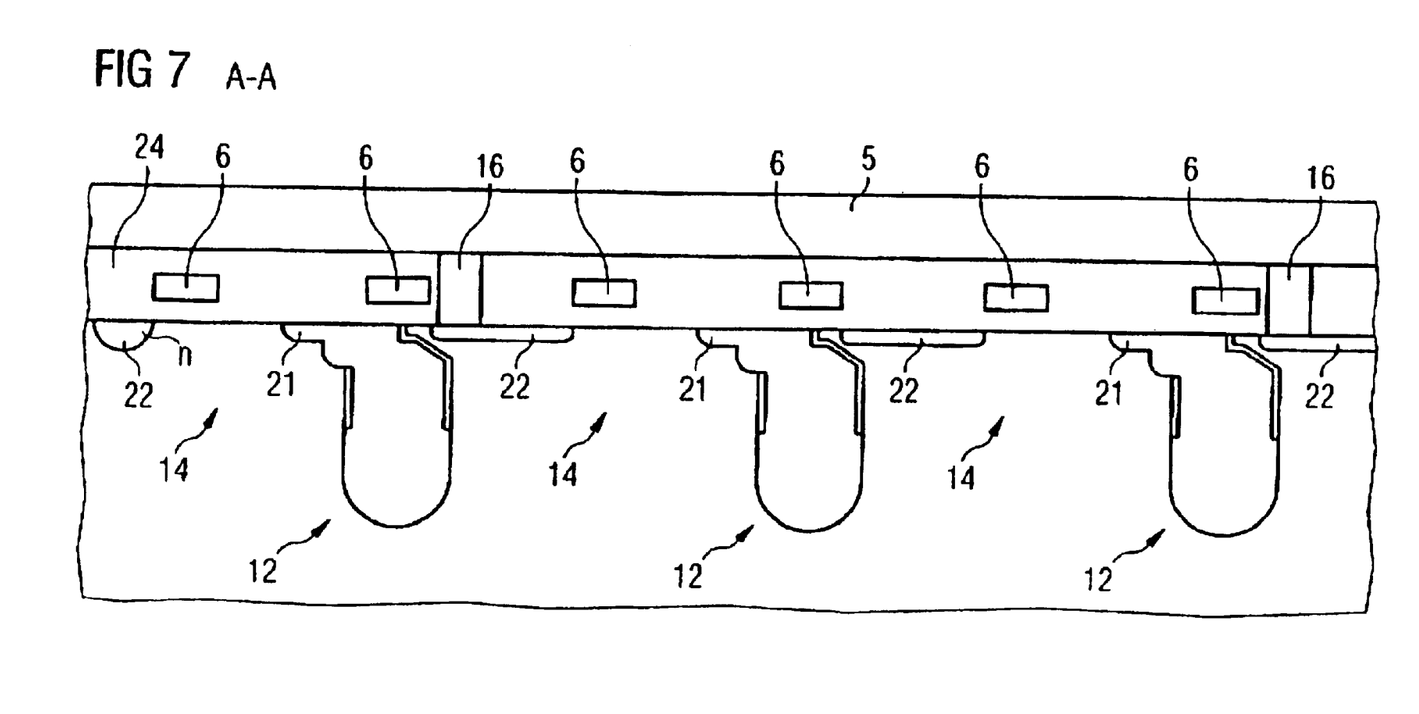
FIG. 7 is a fragmentary, cross-sectional view through a row of trench capacitors in FIG. 6 along section line A—A.

FIG. 7 schematically illustrates a section A—A through FIG. 6 on a row of trench capacitors 12. This clearly reveals the configuration of the word lines 6, which are disposed above the active regions 14 between the first and second terminal regions 21, 22 and above the trench capacitors 12. Moreover, in the case of every second trench capacitor 12, a contact bit terminal 16 is at least partly disposed above the trench capacitor 12 and electrically conductively connects a second terminal region 22 to a bit line 5. Depending on the embodiment, the contact bit terminals 16 may also be disposed laterally offset with respect to the trench capacitors.

Figure 8:
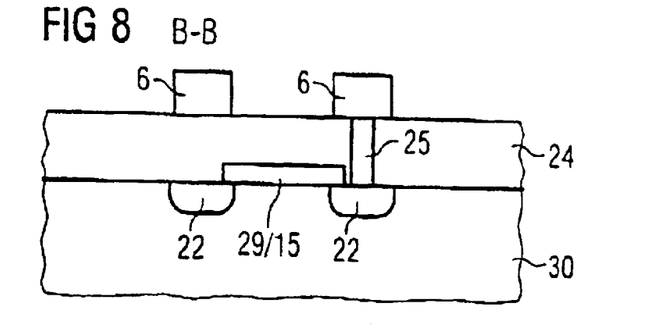
FIG. 8 is a fragmentary, cross-sectional view through a first embodiment of the connecting line according to the invention along section line B—B of FIG. 6.

FIG. 8 illustrates a section B—B from FIG. 6, which is disposed perpendicular to the rows of trench capacitors and is taken through a connecting line 15. In the exemplary embodiment illustrated, the connecting line 15 is embodied in the form of a line layer 29 applied on the semiconductor substrate 30. In the lateral end regions, the line layer 29 in each case overlaps associated second terminal regions 22 of two active regions 14 of rows disposed one beside the other. The line layer 29 has a layer thickness that is significantly less than the length of the contact terminals 16. The layer thickness of the line layer 29, preferably, lies in the range of 10 to 50 nm. Good results were achieved with a layer thickness of 20 nm. Conductive polysilicon is, preferably, used as material for the line layer 29.

Figure 9:
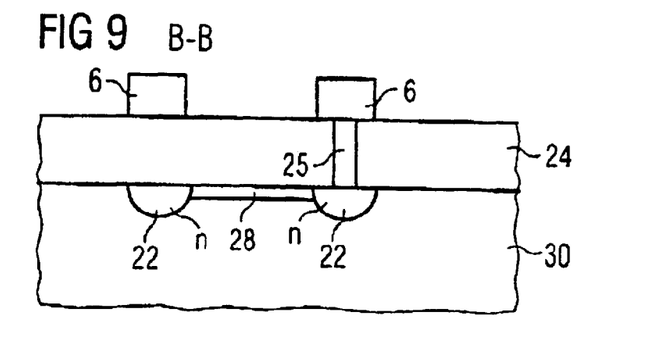
FIG. 9 is a fragmentary, cross-sectional view through a second embodiment of the connecting line according to the invention along section line B—B of FIG. 6.

FIG. 9 shows the section B—B in which the connecting line 15 is embodied in the form of a doping layer 28 in the semiconductor substrate 30. The doping layer 28 is n-doped and merges laterally with two terminal regions 22 of two active regions 14 that are disposed in different rows.

Figure 10:
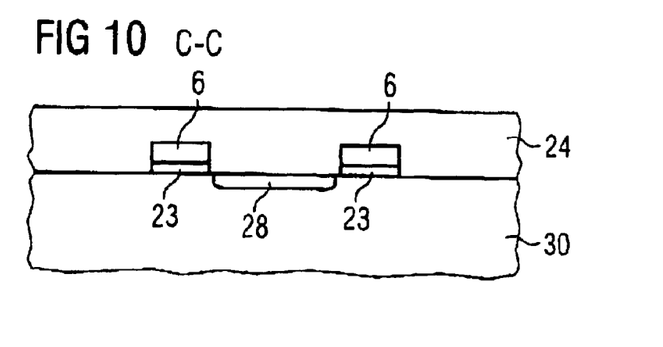
FIG. 10 is a fragmentary, cross-sectional view through the first embodiment of the connecting line of FIG. 8 along section line C—C parallel to the rows of trench capacitors with illustration of the adjacent word lines.

FIG. 10 shows a cross-section C—C from FIG. 6, which is disposed parallel to the rows of trench capacitors and between two rows. In FIG. 10, the connecting line 15 is embodied in the form of a doping layer 28 introduced into the semiconductor substrate 30. The doping layer 28 is n-doped, for example.

Figure 11:
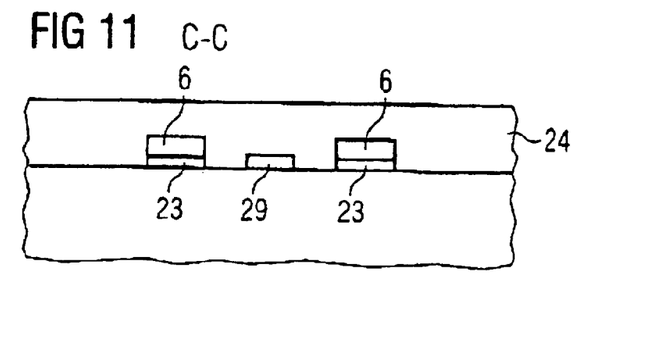
FIG. 11 is a fragmentary, cross-sectional view through the second embodiment of the connecting line of FIG. 8 along section line C—C with illustration of the adjacent word lines.

FIG. 11 shows the cross-section C—C in which the connecting line is embodied in the form of the line layer 29.

Figure 12:
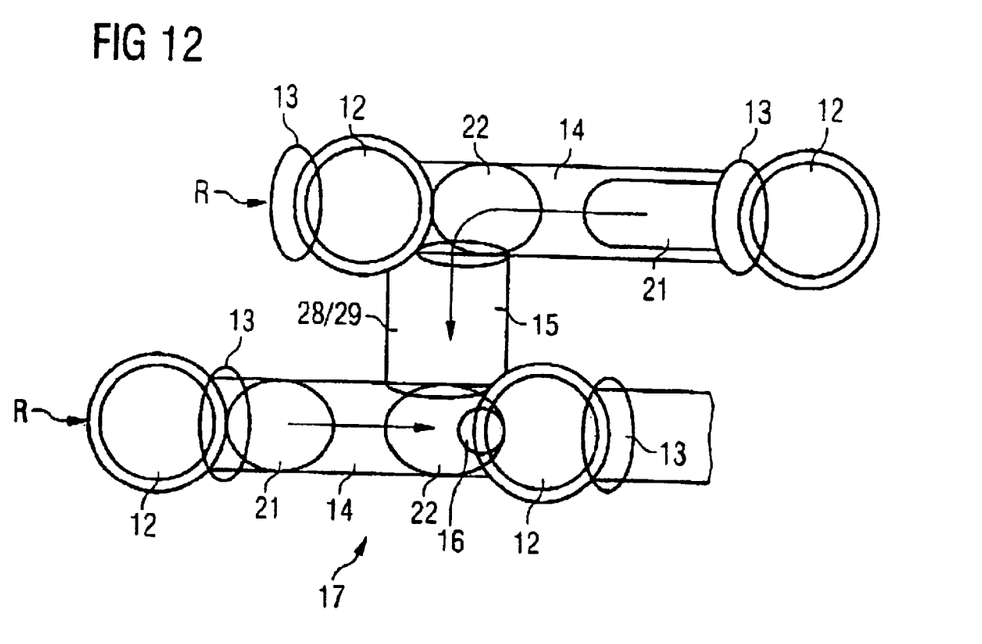
FIG. 12 is a fragmentary cross-sectional view of an enlarged portion of a common terminal region for two trench capacitors according to the invention.

FIG. 12 shows a basic cell from which the memory cell configuration is constructed. The basic cell includes two active regions 14 that are connected to one another through a connecting line 15 and form a common terminal region 17. The contact bit terminal 16 is, preferably, disposed above a trench capacitor that cannot be electrically conductively connected to the common terminal region 17. For a lower packing density, the bit line terminal 16 may also be disposed laterally opposite with respect to the trench capacitor 12. By way of example, the contact bit terminal may also be disposed above the connecting line.

It can be seen that the active regions 14 are in each case laterally delimited and electrically insulated by the adjoining trench capacitors 12. Non-illustrated insulation layers for insulation purposes are disposed along the longitudinal sides of the active regions 14. The possible current flow between the trench capacitors and the common contact bit terminal 16 is indicated schematically in the form of arrows.

The circuit layout according to the invention makes it possible, despite the high density of the trench capacitors, to maintain a relatively large distance between the trench capacitors and, nevertheless, connect two trench capacitors to a bit line through a single contact bit terminal 16. Bit line terminals 16 are saved in such a configuration. Electrical coupling between a word line 6 and a contact bit terminal 16 is, thereby, avoided, which results in reduced signal influencing between the word lines and the bit lines.

As can be seen from FIGS. 10 and 11, the connecting lines 15 are disposed parallel to the word lines 6. However, on account of the embodiment of the connecting line 15, there are scarcely any interactions between the word line 6 and the connecting line 15. In the form of the doping layer 28 there is a relatively large vertical distance between the word line 6 and the doping layer 28 so that the mutual influencing is low. In the embodiment of the line layer 29 in accordance with FIG. 11, too, there is scarcely any interaction since the lateral overlap area between the word line 6 and the line layer 29 is very low or equal to zero. The low degree of overlap is achieved by virtue of the height of the line layer 29 being chosen to be correspondingly small.

Figure 13:
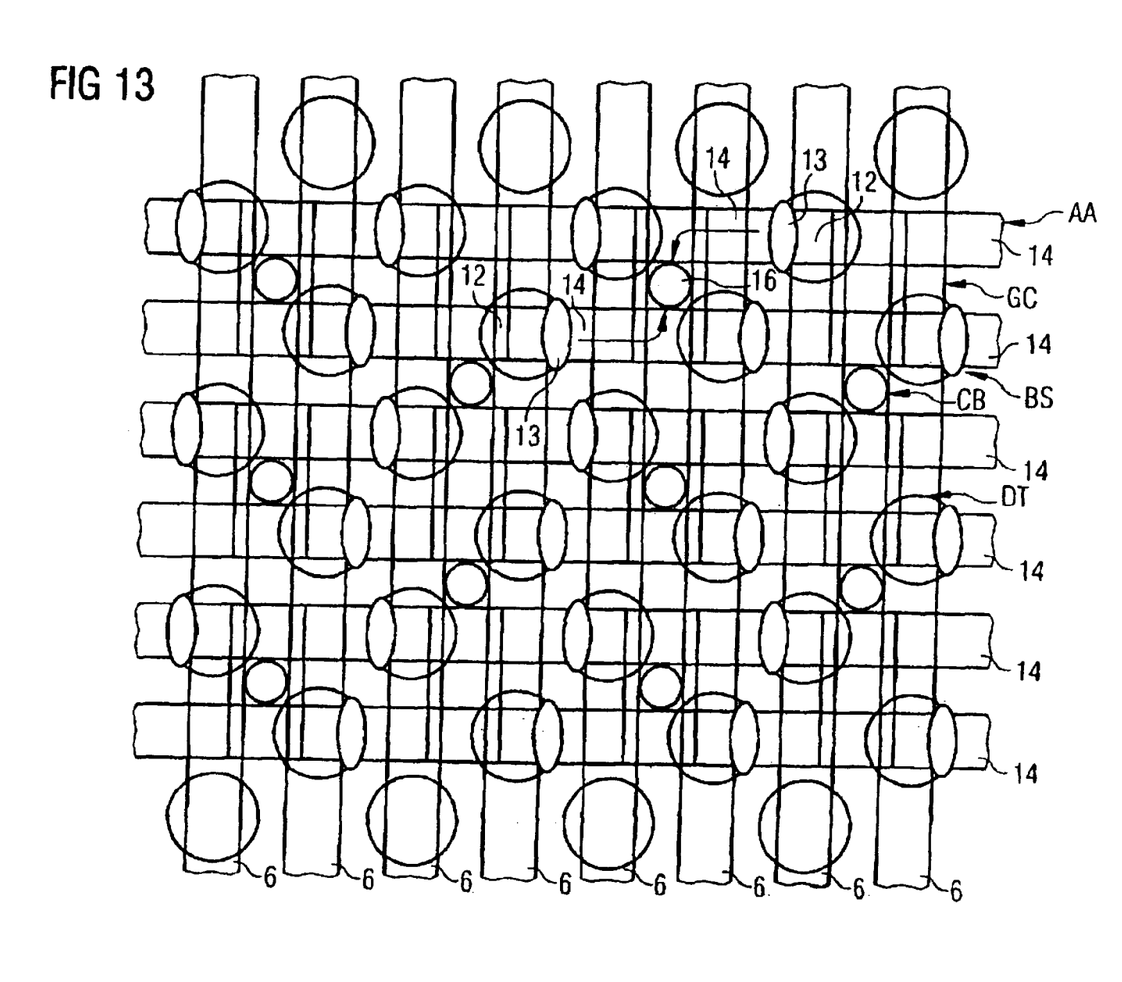
FIG. 13 is a fragmentary cross-sectional view of a detail of a second embodiment of the memory cell array according to the invention.

FIG. 13 shows a second embodiment of a memory cell configuration, which is substantially constructed like the first embodiment described in FIGS. 3 to 12. FIG. 13 does not show the bit lines. One substantial difference is that the contact bit terminals 16 are in each case disposed between two rows of trench capacitors 12, i.e. between two rows of active regions 14. The linking of the contact bit terminals 16 to the contact terminals 13 of the trench capacitors 12 corresponds to the linking described in the first exemplary embodiment of FIGS. 3 to 12. The current flow of the two trench capacitors that are connected to a common contact bit terminal 16 is indicated in the form of arrows.

Figure 14:
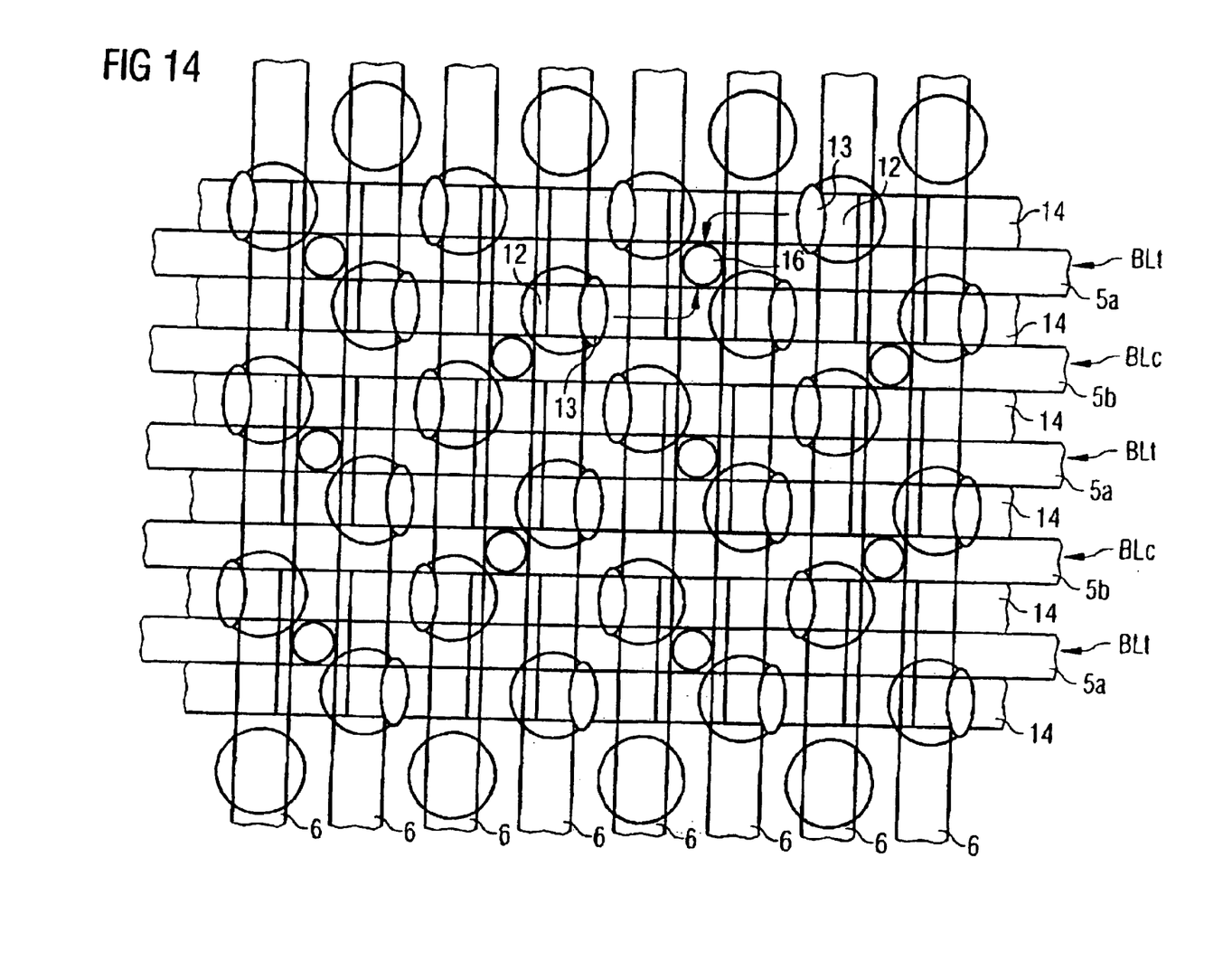
FIG. 14 is a fragmentary cross-sectional view of the detail of the memory cell array of FIG. 13 with bit lines.

FIG. 14 shows the second embodiment of the memory cell configuration with illustration of the true and complementary bit lines 5a, 5b. It can clearly be seen here that the bit lines 5a, 5b are in each case disposed between two rows of active regions 14 and, thus, between two rows of trench capacitors 12 parallel to the rows of active regions 14. Each contact bit terminal 16 is, thus, electrically conductively connected to a corresponding bit line 5a, 5b through a perpendicular connection, obtaining a connection pattern as illustrated in FIG. 2. In such a case, a word line 6 drives memory cells 2 that are connected to every second bit line 5a, 5b through a corresponding contact bit terminal 16. Consequently, for every second bit line 5a, 5b that crosses the word line 6, a word line 6 controls the exchange of charge with an associated memory cell 2.

Figure 15:
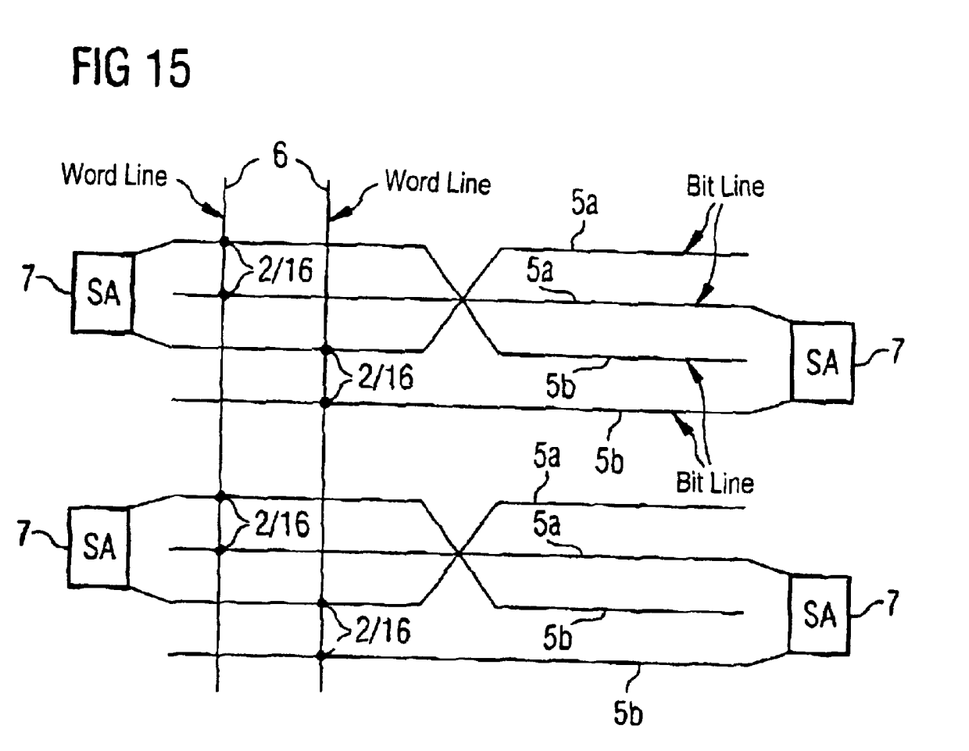
FIG. 15 is a fragmentary block circuit diagram of a further embodiment of a memory cell array according to the invention with crossed bit lines.

FIG. 15 shows a schematic illustration of a second embodiment of a memory cell array with crossed bit lines, in which a word line in each case drives memory cells 2 that are electrically conductively connected to two successive bit lines 5b, 5a, which cross the word line 6, through corresponding contact bit terminals 16. The memory cells 2 that are connected to the nearest two bit lines 5a, 5b that cross the word line 6 are not driven by the word line 6. Only the two memory cells 2 that are connected to the succeeding two bit lines 5b, 5a that cross the word line 6 are, again, driven by the same word line 6. The connection pattern illustrated in FIG. 15 is, thus, obtained, in which a word line 2 in each case drives two bit lines 5a, 5b that are disposed one beside the other and cross the word line 6, and does not drive two following bit lines 5a, 5b. The succeeding bit lines 5a, 5b that cross the word line 6 are, again, driven by the word line 6. In such a context, driving the bit line is understood to be the function that the word line 6 produces an electrically conductive connection between a memory cell 2 and the bit line 5a, 5b.

FIG. 15 shows amplifier circuits 7 disposed on opposite sides of a cell array 9. An amplifier circuit 7 is in each case connected to a true bit line 5a and a complementary bit line 5b. The amplifier circuits 7 disposed on the left-hand side of the memory cell array 9 are connected to crossed bit lines 5a, 5b. The amplifier circuits 7 disposed on the right-hand side of the cell array 9 are connected to non-crossed, i.e., straight, true and complementary bit lines 5a, 5b. In such a configuration, a non-crossed bit line is in each case disposed between a crossed bit line pair. Disposed at specific crossover points between word lines 6 and the bit lines 5a, 5b there are contact bit terminals 16 and memory cells 2 that, as a result of a driving of the word line 6, are electrically conductively connected to a bit line 5a, 5b that crosses the word line 6. In the embodiment illustrated, along a word line 6 in each case at two succeeding crossover points, an electrically conductive connection is formed between a memory cell 2 that is driven by the word line 6 and the bit line 5a, 5b that crosses the word line 6. Afterward there are no terminals, i.e., contact bit terminals 16, disposed at two crossover points. At the succeeding two crossover points there are, again, disposed contact bit terminals 16 that electrically conductively connect the bit line 5a, 5b that crosses the word line 6 to a memory cell 2 that can be electrically conductively connected to the crossing bit line 5a, 5b by the word line 6 through the driving of a transistor. This circuit pattern is obtained by a memory cell configuration as illustrated in FIGS. 3 to 12.

I claim:

1. A memory cell configuration, comprising:
    a semiconductor material having active regions;
    word lines and bit lines;
    memory cells each having a trench capacitor and a selection transistor;
    said trench capacitor:
        being at least partly introduced into said semiconductor material; and
        being electrically conductively connected to a bit line through said selection transistor;
    each of said selection transistors of said memory cells having:
        a control terminal formed by a word line;
        first and second terminal regions formed in an active region of said semiconductor material, said first terminal region being conductively connected to a respective one of said trench capacitors;
    said trench capacitors of said memory cells being disposed in rows;
    said active regions being disposed respectively between two of said trench capacitors of said memory cells;
    a connecting line electrically conductively connecting two second terminal regions of two of said selection transistors of adjacent ones of said rows to one another and forming a common terminal region for two of said trench capacitors of different rows; and
    a contact bit terminal:
        being electrically conductively connected to said common terminal region; and
        being electrically conductively connected to a bit line.

2. The memory cell configuration according to claim 1, wherein said connecting line is introduced into said semiconductor material in the form of a doped region.

3. The memory cell configuration according to claim 1, wherein said connecting line is applied to said semiconductor material in the form of a conductive layer.

4. The memory cell configuration according to claim 3, wherein said conductive layer has a height of between approximately 10 nm and approximately 50 nm.

5. The memory cell configuration according to claim 1, wherein:
    said contact bit terminal is disposed between two nearest ones of said word lines;

a further word line is disposed beside each nearest word line;

further word lines form said control terminals of said selection transistors; and said second terminal regions are part of said common terminal region electrically conductively connected to said contact bit terminal.

6. The memory cell configuration according to claim 1, wherein:

said trench capacitor has an upwardly tapering form in cross-section;

said second terminal region of a respective selection transistor of an adjacent one of said trench capacitors is at least partly disposed above said trench capacitor; and said contact bit terminal is at least partly disposed above said trench capacitor and is electrically conductively connected to said second terminal region and to said bit line.

7. The memory cell configuration according to claim 1, wherein said word lines are at least partly routed above said trench capacitors.

8. The memory cell configuration according to claim 1, wherein a trench capacitor has a center and is surrounded by four trench capacitors each having centers at the same distance from said center of said trench capacitor.

9. The memory cell configuration according to claim 1, further comprising amplifier circuits, said bit lines being true and complementary bit lines alternately disposed one beside the other, a true and a complementary bit line forming a bit line pair, said bit line pair being routed to one of said amplifier circuits, said bit lines of said bit line pair being disposed in transposed fashion.

10. The memory cell configuration according to claim 1, wherein said trench capacitors of two of said rows disposed one beside the other are disposed offset with respect to one another.

11. The memory cell configuration according to claim 1, wherein:

said contact bit terminal is disposed between two rows of said trench capacitors; and said bit lines are disposed between said rows of said trench capacitors and parallel to said rows of trench capacitors.

12. The memory cell configuration according to claim 9, wherein:

said contact bit terminal is disposed between two rows of said trench capacitors; and at least one of said bit lines and said true and complementary bit lines are disposed between said rows of said trench capacitors and parallel to said rows of trench capacitors.

13. The memory cell configuration according to claim 1, wherein said connecting line is a doped region in said semiconductor material.

14. The memory cell configuration according to claim 1, wherein said connecting line is a conductive layer applied to said semiconductor material.

15. The memory cell configuration according to claim 1, wherein:

said contact bit terminal is disposed between two nearest ones of said word lines;

further word lines are disposed respectively beside each nearest word line;

said further word lines form said control terminals of said selection transistors; and said second terminal regions are part of said common terminal region.

16. The memory cell configuration according to claim 1, wherein:

said bit lines are true and complementary bit lines alternately disposed one beside the other;

respective ones of said true bit line and said complementary bit line form bit line pairs;

amplifier circuits are provided;

each of said bit line pairs is routed to one of said amplifier circuits; and said bit lines of each of said bit line pairs are disposed in transposed fashion.

* * * * *